(12) United States Patent  
Park et al.

(10) Patent No.: US 11,965,244 B2
(45) Date of Patent: *Apr. 23, 2024

(54) SUBSTRATE PROCESSING METHOD, SUBSTRATE PROCESSING APPARATUS USING THE SAME, AND SEMICONDUCTOR DEVICE MANUFACTURING METHOD

(71) Applicant: WONIK IPS CO., LTD., Pyeongtaek-si (KR)

(72) Inventors: Kyung Park, Seoul (KR); Hyeon Beom Gwon, Seoul (KR); Dae Seong Lee, Dongducheon-si (KR)

(73) Assignee: WONIK IPS CO., LTD, Pyeongtaek-si (KR)

( * ) Notice: Subject to any disclaimer, the term of this patent is extended or adjusted under 35 U.S.C. 154(b) by 0 days.

This patent is subject to a terminal disclaimer.

(21) Appl. No.: 17/411,939

(22) Filed: Aug. 25, 2021

(65) Prior Publication Data

US 2022/0064796 A1 Mar. 3, 2022

(30) Foreign Application Priority Data

Aug. 26, 2020 (KR) .................. 10-2020-0107575

(51) Int. Cl.
*C23C 16/34* (2006.01)
*C23C 16/455* (2006.01)
*H01L 21/02* (2006.01)
(52) U.S. Cl.
CPC ........ *C23C 16/45557* (2013.01); *C23C 16/34* (2013.01); *C23C 16/45527* (2013.01); *H01L 21/02186* (2013.01); *H01L 21/0228* (2013.01)

(58) Field of Classification Search
CPC ... C23C 16/56; C23C 16/34; C23C 16/45557; H01L 21/0228
See application file for complete search history.

(56) References Cited

U.S. PATENT DOCUMENTS

2007/0187386 A1* 8/2007 Kim .................. H01L 22/12
219/385
2017/0062249 A1 3/2017 Aoyama et al.
(Continued)

FOREIGN PATENT DOCUMENTS

CN 1323057 A 11/2001
CN 106486397 A 3/2017
(Continued)

OTHER PUBLICATIONS

"Normal pressure." Merriam-Webster.com Dictionary, Merriam-Webster, https://www.merriam-webster.com/dictionary/normal%20pressure. Accessed Oct. 29, 2020 by internet archive wayback machine: https://web.archive.org/web/20201029170154/https:// www.merriam-webster.com/dictionary/normal%20pressure (Year: 2020).

*Primary Examiner* — Elizabeth A Burkhart
(74) *Attorney, Agent, or Firm* — William Park & Associates Ltd.

(57) ABSTRACT

The present invention disclosed herein relates to a substrate processing method, and more particularly, to: a substrate processing method in which a flow rate of a process gas in a depressurizing operation is regulated in a pressure changing process for improving properties of a thin film; a substrate processing apparatus using the substrate processing method; and a semiconductor manufacturing method.

20 Claims, 7 Drawing Sheets

(56) References Cited

U.S. PATENT DOCUMENTS

| | | | |
|---|---|---|---|
| 2017/0233866 A1* | 8/2017 | Oikawa | H01L 21/02595 |
| | | | 438/5 |
| 2019/0148178 A1 | 5/2019 | Liang et al. | |
| 2021/0118682 A1* | 4/2021 | Jang | H01L 21/28088 |
| 2022/0127725 A1 | 4/2022 | Lee et al. | |

FOREIGN PATENT DOCUMENTS

| | | | |
|---|---|---|---|
| JP | 2009539231 A | 11/2009 | |
| JP | 2015026692 A | 2/2015 | |
| JP | 2017045982 A | 3/2017 | |
| JP | 2017045983 A | 3/2017 | |
| JP | 2020521876 A | 7/2020 | |
| KR | 1020200006422 A | 1/2020 | |

* cited by examiner

FIG. 4

| | | IN DEPRESSURIZING OPERATION DURING PRESSURE CHANGING PROCESS, CHANGE IN SHEET RESISTANCE ACCORDING TO CHANGE IN GAS-SUPPLYING FLOW RATE PROCESS GAS: H2, PROCESS TEMPERATURE: 600 ℃, PROCESS PRESSURE RANGE: 1atm~2atm | | | |
|---|---|---|---|---|---|
| EMBODIMENT | GAS-SUPPLYING FLOW RATE/ SHEET RESISTANCE | PRESSURIZING OPERATION (1atm→2atm) | PRESSURE HOLDING OPERATION (2atm) | DEPRESSURIZING OPERATION (2atm→1atm) | EFFECTS |
| FIRST EMBODIMENT | GAS-SUPPLYING FLOW RATE(L) | 40 | 40 | 20 | REDUCTION IN SHEET RESISTANCE BY ABOUT 12% |
| | SHEET RESISTANCE($\Omega$/sq) | 101.7 | 101.7 | 89.94 | |
| SECOND EMBODIMENT | GAS-SUPPLYING FLOW RATE(L) | 40 | 40 | 10 | REDUCTION IN SHEET RESISTANCE BY ABOUT 13% |
| | SHEET RESISTANCE($\Omega$/sq) | 101.34 | 101.34 | 88.24 | |
| THIRD EMBODIMENT | GAS-SUPPLYING FLOW RATE(L) | 40 | 40 | 0 | REDUCTION IN SHEET RESISTANCE BY ABOUT 15% |
| | SHEET RESISTANCE($\Omega$/sq) | 102.05 | 102.05 | 87.09 | |

# SUBSTRATE PROCESSING METHOD, SUBSTRATE PROCESSING APPARATUS USING THE SAME, AND SEMICONDUCTOR DEVICE MANUFACTURING METHOD

CROSS-REFERENCE TO RELATED APPLICATIONS

This U.S. non-provisional patent application claims priority under 35 U.S.C. § 119 of Korean Patent Application No. 10-2020-0107575, filed on Aug. 26, 2020, the entire contents of which are hereby incorporated by reference.

FIELD OF THE INVENTION

The present invention disclosed herein relates to a substrate processing method, and more particularly, to: a substrate processing method in which a flow rate of a process gas in a depressurizing operation is regulated in a pressure changing process for improving properties of a thin film; a substrate processing apparatus using the substrate processing method; and a semiconductor manufacturing method.

BACKGROUND ART

Elements such as semiconductors, LCD substrates, and OLED substrates are manufactured through semiconductor processes including one or more deposition processes and etching processes.

In particular, the semiconductor element has a thin film which is formed, by a deposition process, on the substrate surface so as to form circuit patterns and the like, and this formation may be performed by various semiconductor processes such as CVD, PVD, and ALD.

Meanwhile, after the thin film is formed on the substrate through the deposition process, a substrate processing process may be performed as in Patent Document 1. In this substrate processing process, pressurization and depressurization are repeated within a closed chamber so as to remove impurities within a thin film and improve the properties of thin film.

However, in the substrate processing process described above, supplying and venting of a process gas with respect to the inside of a chamber are continuously performed in not only an operation of increasing a pressure within the chamber but also an operation of decreasing the pressure. Thus, the capacity of a scrubber for processing vented process gases becomes increased, and an usage amount of process gases are also increased, causing an increase in substrate processing costs.

(Patent Document 1) KR10-2020-0006422 A.

SUMMARY OF THE INVENTION

To solve the above-mentioned limitations, the present invention provides a substrate processing method and a semiconductor manufacturing method. Through this, in a process of performing pressurization and depressurization inside a chamber during processes, sheet resistance of a thin film may be improved by reducing a flow rate of a process gas supplied in a depressurizing operation, and substrate processing costs may be significantly decreased by reducing a usage amount of the process gas and a burden on the processing capacity of a scrubber.

In accordance with an embodiment of the present invention, a substrate processing method uses a substrate processing apparatus which includes a chamber (10) configured to form a processing space (S) for substrate processing, a substrate support installed in the chamber (10) to support a substrate (1), a gas sprayer installed above the substrate support to spray a gas for performing processes, and a vent configured to vent a gas of the processing space (S) and including a valve for controlling a pressure, wherein the substrate processing method includes a pressure changing operation (S1) repeated at least one time, wherein the pressure changing operation (S1) includes: a pressurizing operation (S10) of increasing an internal pressure of the chamber (10) from a first pressure ($P_i$) to a second pressure ($P_h$) higher than the atmospheric pressure, by injecting a process gas into the processing space (S); and a depressurizing operation (S30) of decreasing the internal pressure of the chamber (10) from the second pressure ($P_h$) to a third pressure ($P_f$), wherein a process gas-supplying flow rate (M3) in the depressurizing operation (S30) is lower than a process gas-supplying flow rate (M1) in the pressurizing operation (S10), and the third pressure ($P_f$) is the atmospheric pressure.

In accordance with an embodiment of the present invention, a substrate processing method uses a substrate processing apparatus which includes a chamber (10) configured to form a processing space (S) for substrate processing, a substrate support installed in the chamber (10) to support a substrate (1), a gas sprayer installed above the substrate support to spray a gas for performing processes, a vent configured to vent a gas of the processing space (S) and including a valve for controlling a pressure, and a heater (50) installed on the outside of the chamber (10), wherein the substrate processing method includes a pressure changing operation (S1) repeated at least one time, wherein the pressure changing operation (S1) includes: a pressurizing operation (S10) of increasing an internal pressure of the chamber (10) from a first pressure ($P_i$) to a second pressure ($P_h$) higher than the atmospheric pressure, by injecting a process gas into the processing space (S); and a depressurizing operation (S30) of decreasing the internal pressure of the chamber (10) from the second pressure ($P_h$) to a third pressure ($P_f$), wherein a process gas-supplying flow rate (M3) in the depressurizing operation (S30) is lower than a process gas-supplying flow rate (M1) in the pressurizing operation (S10), and the third pressure ($P_f$) is lower than the atmospheric pressure.

The depressurizing operation (S30) may include: a first depressurizing operation (S31) of decreasing the internal pressure of the chamber (10) from the second pressure ($P_h$) to the atmospheric pressure; and a second depressurizing operation (S33) of decreasing the internal pressure of the chamber (10) from the atmospheric pressure to the third pressure ($P_f$) lower than the atmospheric pressure, wherein the internal pressure of the chamber (10) is regulated by using a vacuum pump in the second depressurizing operation (S33).

The depressurizing operation (S30) may include an atmospheric pressure holding operation (S32) before the internal pressure is changed to the second depressurizing operation (S33) after reaching the atmospheric pressure from the first depressurizing operation (S31), wherein the internal pressure of the chamber (10) remains at the atmospheric pressure for a predetermined period of time in the atmospheric pressure holding operation (S32).

The substrate processing method according to the present invention may include a pressure holding operation (S20) before the pressurizing operation (S10) is changed to the depressurizing operation (S30) after reaching the second pressure ($P_h$), wherein the internal pressure of the chamber

(10) remains at the second pressure ($P_h$) for a predetermined period of time in the pressure holding operation (S20).

In the depressurizing operation (S30), the internal pressure of the chamber (10) may be reduced by cutting off the supply of the process gas to the processing space (S) and venting the process gas.

A process gas-supplying flow rate (M2) in the pressure holding operation (S20) may be lower than the process gas-supplying flow rate (M1) in the pressurizing operation (S10).

A thin film formed on the substrate (1) may be made of one of Ti, TiN, W, and WN.

The process gas may include one of $H_2$, $D_2$, and $NH_3$, or a combination thereof.

The pressure changing operation (S1) may be performed at a temperature of about 400° C. to about 800° C.

In accordance with an embodiment of the present invention, a substrate processing apparatus is to perform the substrate processing method, wherein the substrate processing apparatus includes a gas utility which controls the pressure of the processing space (S) to perform the pressure changing operation (S1).

In accordance with an embodiment of the present invention, a substrate processing method uses a substrate processing apparatus which includes a chamber (10) configured to form a processing space (S) for substrate processing, a substrate support installed in the chamber (10) to support a substrate (1), a gas sprayer installed above the substrate support to spray a gas for performing processes, and a vent configured to vent a gas of the processing space (S) and including a valve for controlling a pressure, wherein the chamber (10) includes: an outer tube (11) which has a protection space formed therein and a first inlet formed in a lower portion thereof; and an inner tube (12) which has the processing space (S) formed therein and a second inlet formed in a lower portion thereof, wherein a portion of the inner tube (12) is accommodated in the outer tube (11), and a portion of the inner tube (12), in which the second inlet is formed, protrudes to the outside of the outer tube (11), wherein the substrate processing method includes a pressure changing operation (S1) repeated at least one time, wherein the pressure changing operation (S1) includes: a pressurizing operation (S10) of increasing an internal pressure of the inner tube (12) from a first pressure ($P_i$) to a second pressure ($P_h$) higher than the atmospheric pressure, by injecting a process gas into the processing space (S); and a depressurizing operation (S30) of decreasing the internal pressure of the inner tube (12) from the second pressure ($P_h$) to a third pressure ($P_f$), wherein a process gas-supplying flow rate (M3) to the inner tube (12) in the depressurizing operation (S30) is lower than a process gas-supplying flow rate (M1) to the inner tube (12) in the pressurizing operation (S10), and the third pressure ($P_f$) is the atmospheric pressure.

In accordance with an embodiment of the present invention, a substrate processing method uses a substrate processing apparatus which includes a chamber (10) configured to form a processing space (S) for substrate processing, a substrate support installed in the chamber (10) to support a substrate (1), a gas sprayer installed above the substrate support to spray a gas for performing processes, a vent configured to vent a gas of the processing space (S) and including a valve for controlling a pressure, and a heater (50) installed on the outside of the chamber 10, wherein the chamber (10) includes: an outer tube (11) which has a protection space formed therein and having a first internal pressure and a first inlet formed in a lower portion thereof; and an inner tube (12) which has the processing space (S) formed therein and having an internal pressure and a second inlet formed in a lower portion thereof, wherein a portion of the inner tube (12) is accommodated in the outer tube (11), and a portion of the inner tube (12), in which the second inlet is formed, protrudes to the outside of the outer tube (11), wherein the substrate processing method includes a pressure changing operation (S1) repeated at least one time, wherein the pressure changing operation (S1) includes: a pressurizing operation (S10) of increasing an internal pressure of the inner tube (12) from a first pressure ($P_i$) to a second pressure ($P_h$) higher than the atmospheric pressure, by injecting a process gas into the processing space (S); and a depressurizing operation (S30) of decreasing the internal pressure of the inner tube (12) from the second pressure ($P_h$) to a third pressure ($P_f$), wherein a process gas-supplying flow rate (M3) to the inner tube (12) in the depressurizing operation (S30) is lower than a process gas-supplying flow rate (M1) to the inner tube (12) in the pressurizing operation (S10), and the third pressure ($P_f$) is lower than the atmospheric pressure.

The depressurizing operation (S30) may include: a first depressurizing operation (S31) of decreasing the internal pressure of the inner tube (12) from the second pressure ($P_h$) to the atmospheric pressure; and a second depressurizing operation (S33) of decreasing the internal pressure of the inner tube (12) from the atmospheric pressure to the third pressure ($P_f$) lower than the atmospheric pressure, wherein the internal pressure of the inner tube (12) is regulated by using a vacuum pump in the second depressurizing operation (S33).

The depressurizing operation (S30) may include an atmospheric pressure holding operation (S32) before the internal pressure is changed to the second depressurizing operation (S33) after reaching the atmospheric pressure from the first depressurizing operation (S31), wherein the internal pressure of the inner tube (12) remains at the atmospheric pressure for a predetermined period of time in the atmospheric pressure holding operation (S32).

The substrate processing method according to the present invention may include a pressure holding operation (S20) before the internal pressure is changed to the depressurizing operation (S30) after reaching the second pressure ($P_h$) from the pressurizing operation (S10), wherein the internal pressure of the inner tube (12) remains at the second pressure ($P_h$) for a predetermined period of time in the pressure holding operation (S20).

In the depressurizing operation (S30), the internal pressure of the inner tube (12) may be reduced by cutting off the supply of the process gas to the processing space (S) and venting the process gas.

A process gas-supplying flow rate (M2) to the inner tube (12) in the pressure holding operation (S20) may be lower than the process gas-supplying flow rate (M1) to the inner tube (12) in the pressurizing operation (S10).

A thin film formed on the substrate (1) may be made of one of Ti, TiN, W, and WN.

The process gas may include one of $H_2$, $D_2$, and $NH_3$, or a combination thereof.

The pressure changing operation (S1) may be performed at a temperature of about 400° C. to about 800° C.

In accordance with an embodiment of the present invention, a substrate processing apparatus is to perform the substrate processing method, wherein the substrate processing apparatus includes: an outer manifold which supports a lower portion of the outer tube (11), forms a first inner space connected to the protection space, and has an outer gas supply port and an outer gas vent port formed around a side wall thereof; and an inner manifold which supports a lower portion of the inner tube (12), forms a second inner space connected to the protection space, and has an inner gas supply port and an inner gas vent port formed around a side wall thereof; wherein the substrate processing apparatus includes a gas utility which controls the pressure of each of the processing space (S) and the protection space to perform the pressure changing operation (S1).

In accordance with an embodiment of the present invention, a semiconductor device manufacturing method includes: a deposition operation of forming a thin film on a surface; and a substrate processing operation of improving thin-film properties after performing the deposition process, wherein the substrate processing operation is performed at least one time and performed through the substrate processing method.

BRIEF DESCRIPTION OF THE DRAWINGS

The accompanying drawings are included to provide a further understanding of the present invention, and are incorporated in and constitute a part of this specification. The drawings illustrate exemplary embodiments of the present invention and, together with the description, serve to explain principles of the present invention. In the drawings:

FIG. 4 is a table showing effects of reducing sheet resistance of a thin film formed by a substrate processing method according to the present invention.

DETAILED DESCRIPTION OF THE PREFERRED EMBODIMENTS

Figure 1A:
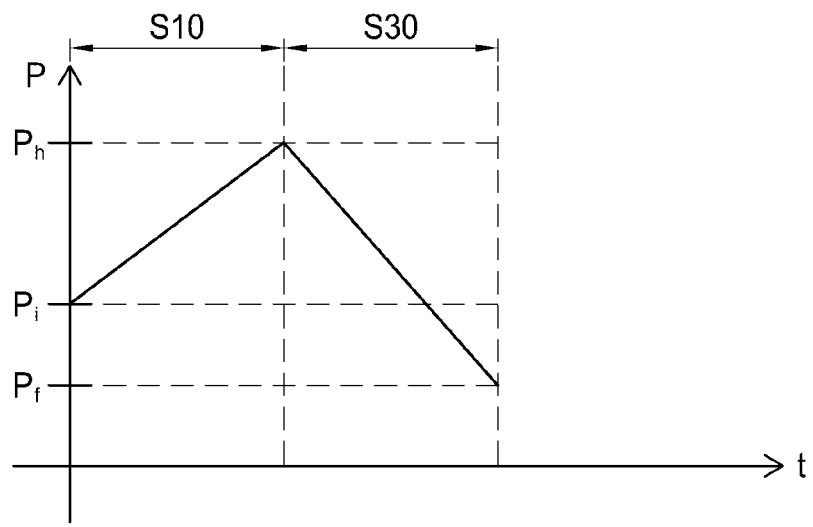
FIG. 1A is a graph showing a change in pressure inside a chamber with respect to a process performing time as a substrate processing method according to the present invention is performed.

Hereinafter, a substrate processing method according to the present invention will be described with reference to the accompanying drawings. A substrate processing method according to the present invention uses a substrate processing apparatus, which includes a chamber 10 that forms a processing space S for substrate processing, a substrate support installed in the chamber 10 to support a substrate 1, a gas sprayer installed above the substrate support to spray a gas for performing processes, and a vent that vents a gas of the processing space S and includes a valve for controlling a pressure. The substrate processing method includes a pressure changing operation (S1) repeated at least one time, and the pressure changing operation (S1) includes: a pressurizing operation (S10) of increasing an internal pressure of the chamber 10 from a first pressure $P_i$ to a second pressure $P_h$ higher than the atmospheric pressure, by injecting a process gas into the processing space S; and a depressurizing operation (S30) of decreasing the internal pressure of the chamber 10 from the second pressure $P_h$ to a third pressure Pf.

Here, the substrate 1 is a substrate for constituting an element, such as an LCD board or an OLED board, manufactured through a semiconductor process, and any substrate may be used as long as a thin film deposition process and a substrate processing process for improving thin-film properties are additionally performed thereon.

In particular, any substrate may be used as the substrate 1 as long as an improvement in thin-film properties is required after a thin film is formed on the substrate through a deposition process.

Also, the type of thin film formed on the substrate 1 may be various, and for example, if the thin film includes a metal, the thin film may include Ti, TiN, W, WN, and Ru.

Here, the thin film may be made by performing various deposition processes such as PVD, CVD, PECVD, and ALD, and preferably, may be made by performing the ALD process.

Meanwhile, the type of process gas supplied to the processing space S is not limited thereto. Any process gas may be used as long as the process gas improves thin-film properties through a change in pressure on the basis of material properties of a substrate and a thin film formed on a surface of the substrate.

For example, the substrate and the thin film formed on the surface thereof may include impurities which are supposed to be removed through the substrate processing method according to the present invention, and it is preferable to supply a process gas which may remove the impurities through the substrate processing method according to the present invention.

For example, various types of gases may be used as the process gas to be supplied to the processing space S. For example, the process gas may include $H_2$, $D_2$, and $NH_3$, and any gas may be used as long as the gas includes hydrogen.

Here, the thin film including the metal may be a thin film including various metals such has Ti, TiN, W, WN, and Ru.

Also, the predetermined temperature may be diversely changed according to conditions for improving thin-film properties and types of the thin film and the process gas.

For example, the process temperature for a TiN thin film deposited through an ALD method may be set from about 400° C. to about 800° C., and preferably, to about 550° C.

Meanwhile, the substrate processing method according to the present invention may be performed by the process conditions described above, and the substrate processing apparatus for performing the substrate processing method may include the chamber 10 that forms the closed processing space S.

The chamber 10 may have various structures such as a single wafer-type structure or a batch-type structure, and the batch-type structure may have various structures such as a single pipe or a dual pipe.

Figure 2A:
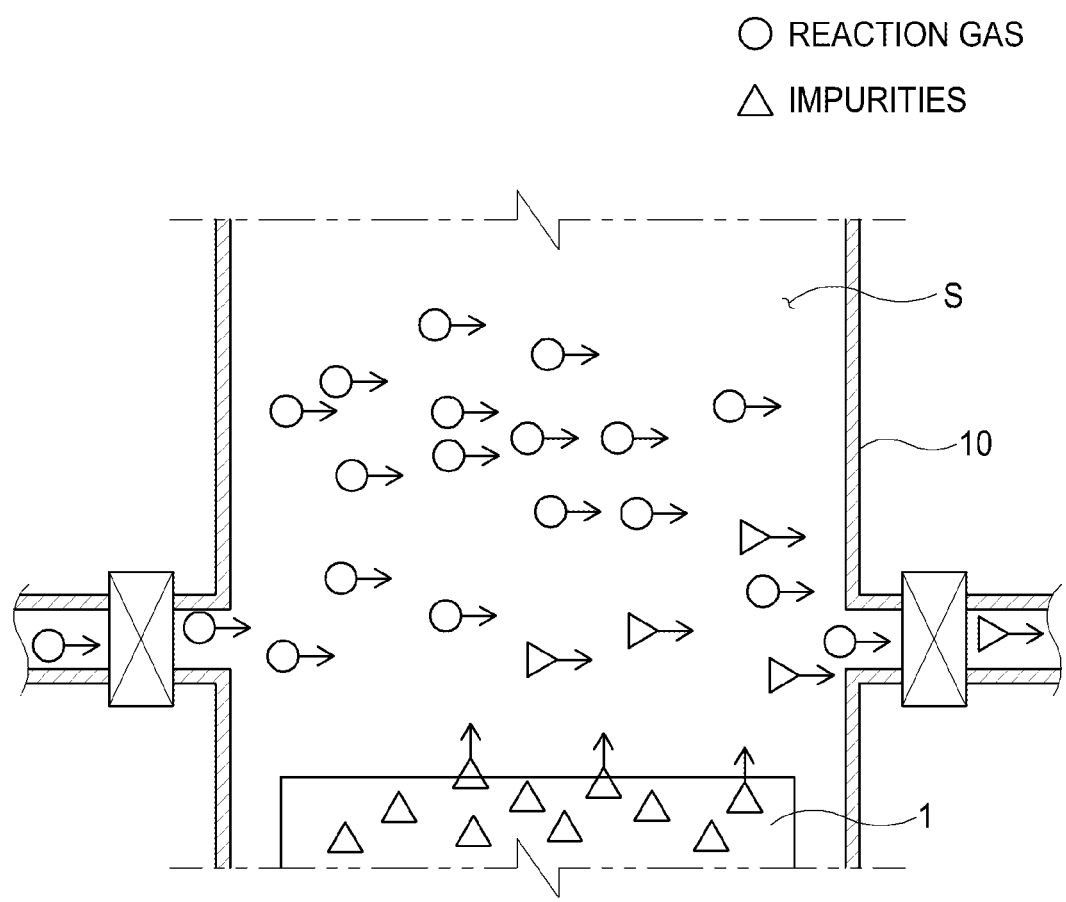
FIG. 2A is a conceptual view showing a state in which, in a single wafer-type chamber structure, impurities within a film are removed while continuously supplying a process gas in a depressurizing operation through a substrate processing method according to the related art.
Figure 2B:
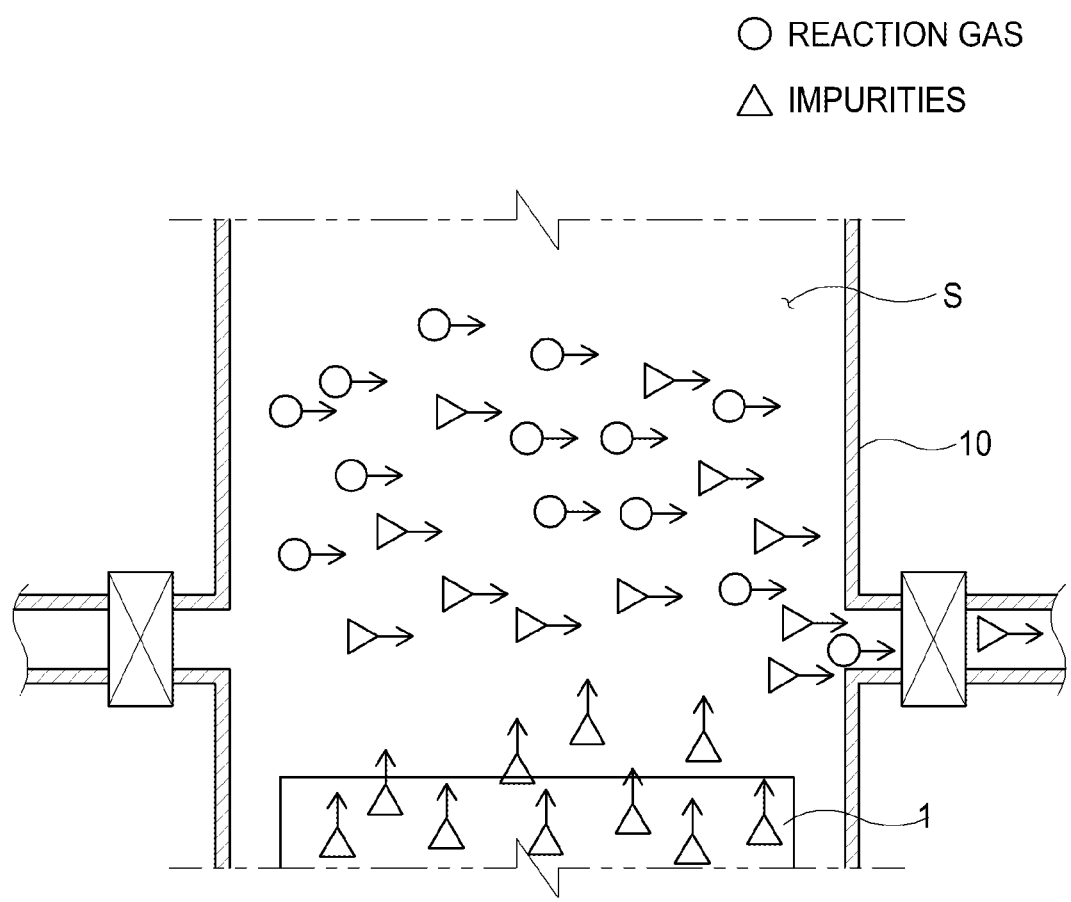
FIG. 2B is a conceptual view showing a state in which impurities within a film are removed while cutting off supply of a process gas in a depressurizing operation through a substrate processing method according to the present invention.
Figure 3A:
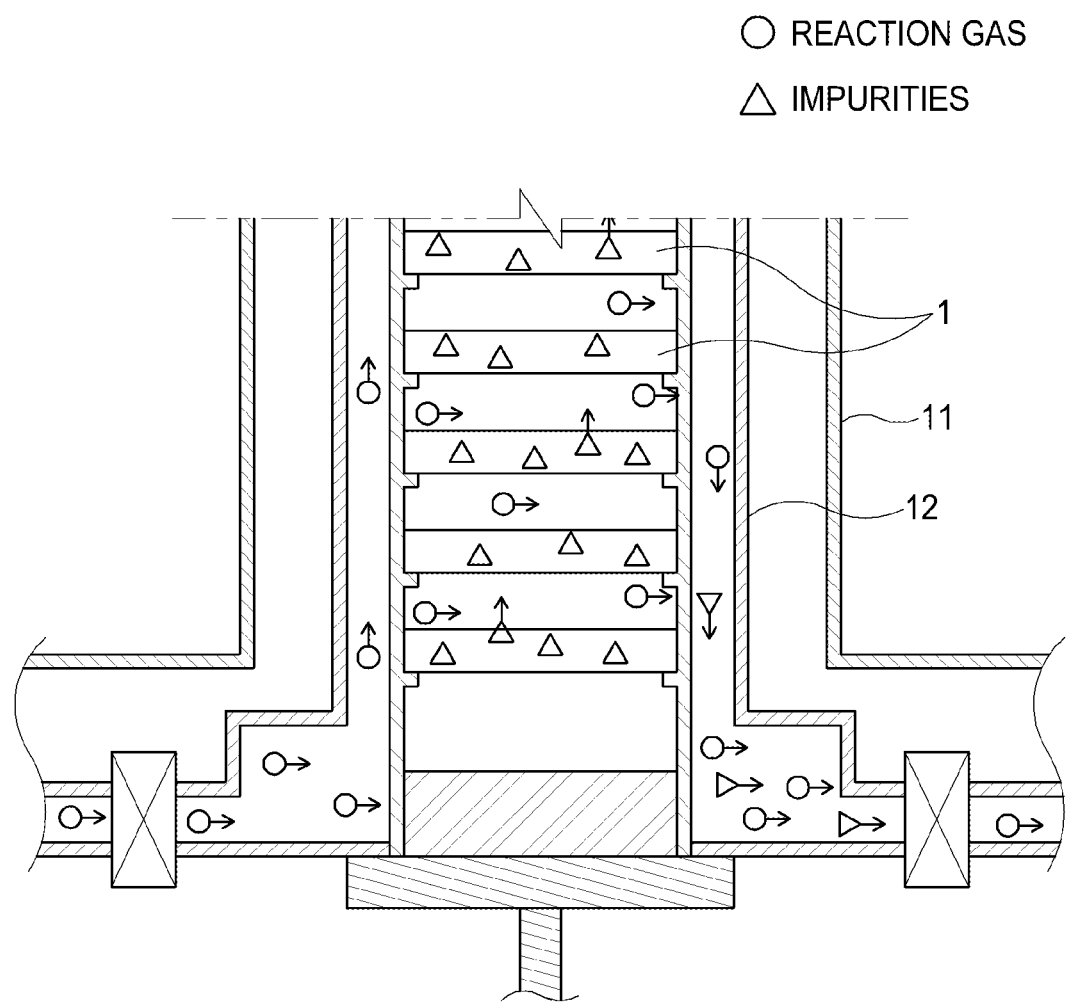
FIG. 3A is a conceptual view showing a state in which, in a batch-type dual pipe chamber structure, impurities within a film are removed while continuously supplying a process gas in a depressurizing operation through a substrate processing method according to the related art.
Figure 3B:
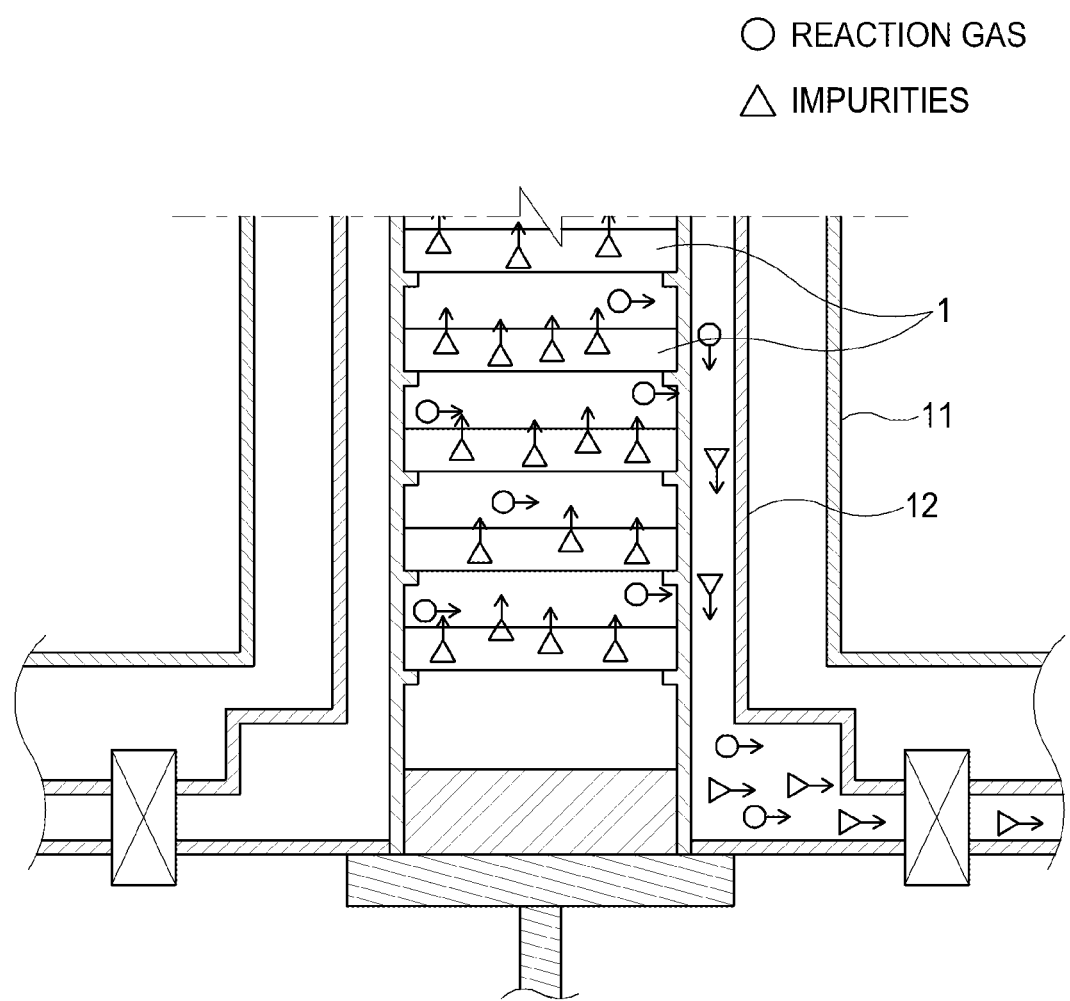
FIG. 3B is a conceptual view showing a state in which, in a batch-type dual pipe chamber structure, impurities within a film are removed while cutting off supply of a process gas in a depressurizing operation through a substrate processing method according to the present invention.

For example, the chamber 10 may have a single wafer-type structure as illustrated in FIGS. 2A and 2B, However, in the substrate processing method according to the present invention performing a pressure changing process, it is preferable to have a batch-type dual pipe structure illustrated in FIGS. 3A to 3B.

In detail, a chamber 10 having the batch-type dual pipe structure illustrated in FIGS. 3A to 3B may include an outer tube 11 which has a protection space formed therein and a first inlet formed in a lower portion thereof and an inner tube 12 which has a processing space S formed therein and a second inlet formed in a lower portion thereof. A portion of the inner tube 12 is accommodated in the outer tube 11, and a portion of the inner tube 12, in which the second inlet is formed, protrudes to the outside of the outer tube 11.

Here, the outer tube 11 does not allow the inner tube 12 to be directly exposed to an external environment and thus may prevent damages to the inner tube 12 due to the external environment. Even if the inner tube 12 is damaged due to unspecified reasons, a damage range by the inner tube 12 is limited to the inside of the outer tube 11. Thus, the reliability of the substrate processing apparatus may be ensured.

In particular, the chamber 10 including the inner tube 12 and the outer tube 11 may stably perform the substrate processing method according to the present invention, by changing process conditions, which will be described layer, for example, by changing an internal pressure of the outer tube 11 in association with the inner tube 12 involving a pressure change such as a pressure higher than the atmospheric pressure or a vacuum pressure lower than the atmospheric pressure.

For example, when a pressure changing operation (S1) is performed, in a case where the pressure within the inner tube 12 is lower than the atmospheric pressure, the pressure within the outer tube 11 may be controlled to be lower than the atmospheric pressure and higher than the pressure of the processing space S, or may remain constant at atmospheric pressure.

Also, in a case where the pressure within the inner tube 12 is higher than the atmospheric pressure, the pressure within the outer tube 11 may be controlled to be higher than the pressure within the inner tube 12.

Meanwhile, the substrate processing apparatus may include a gas utility which controls the pressure of the processing space (S) so as to perform the pressure changing operation (S1).

That is, the gas utility may control a gas supply unit and a gas vent unit to regulate the amount of supplied gas and the amount of vented gas, thereby performing the pressure changing operation (S1).

Here, when the chamber 10 includes the inner tube 12 and the outer tube 11, the gas utility may individually control the pressures of the processing space S and the protection space.

Meanwhile, a heater (not shown) may be additionally installed on the outside of the chamber 10.

Here, the pressure changing process according to the present invention is performed by regulating the internal pressure of the chamber 10 in the single pipe structure or regulating the internal pressure of the inner tube 12 in the dual pipe structure. Hereinafter, the chamber 10 is described as an example, but this encompasses regulation of the internal pressure of the inner tube 12 in the dual pipe structure.

The substrate processing method according to the present invention includes the pressure changing operation (S1) that includes a pressurizing operation (S10) and a depressurizing operation (S30), and the pressure changing operation (S1) may be repeated at least one time.

Figure 1B:
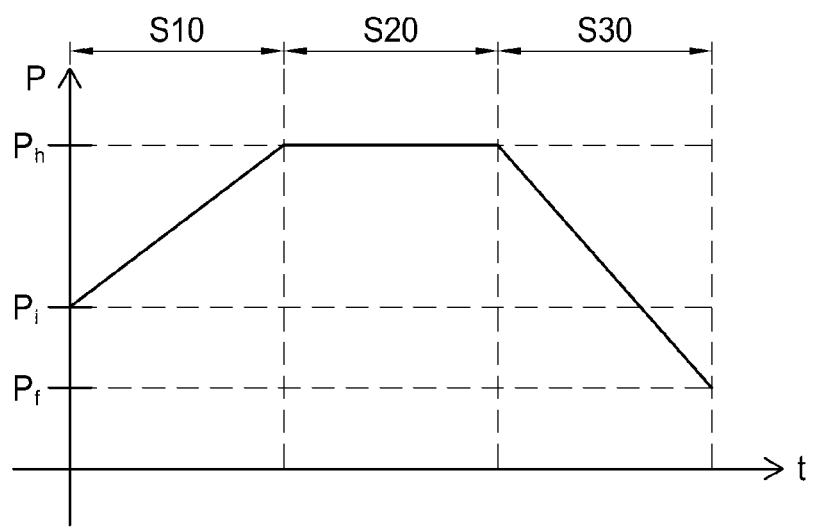
FIG. 1B is a graph showing a change in pressure inside a chamber with respect to a process performing time in a modified example of the substrate processing method according to FIG. 1A.
Figure 1C:
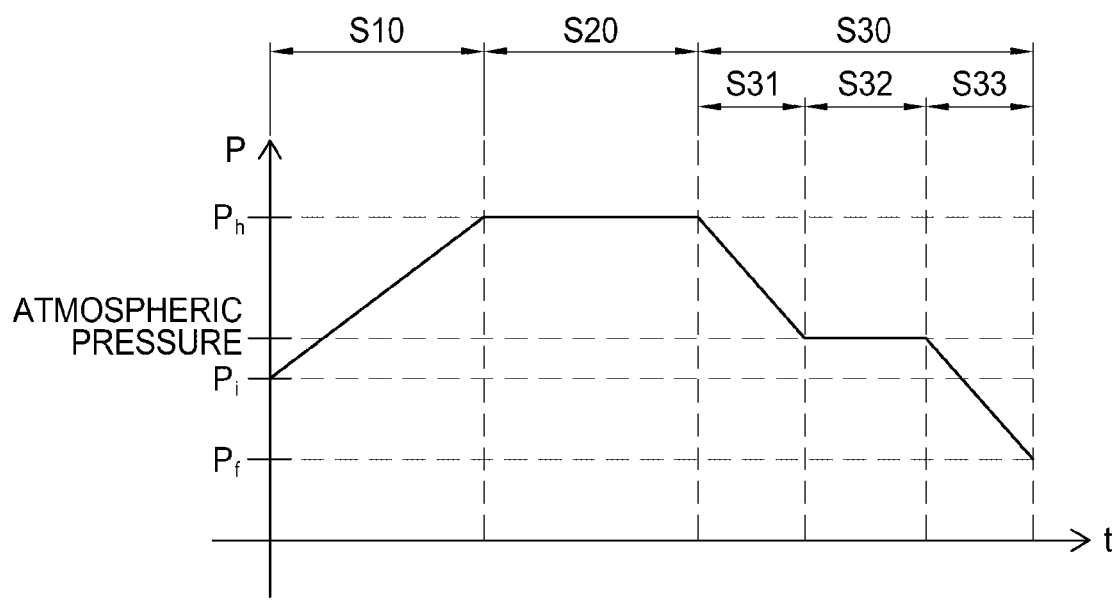
FIG. 1C is a graph showing a change in pressure inside a chamber with respect to a process performing time in a modified example of the substrate processing method according to FIG. 1A.

Here, as illustrated in FIGS. 1A to 1C, the pressurizing operation (S10) is an operation of increasing an internal pressure of the chamber 10 from a first pressure $P_i$ to a second pressure $P_h$ by injecting a process gas, and the pressurizing operation (S10) may be performed under various times and pressures.

In detail, in the pressurizing operation (S10), the pressure within the processing space S is raised from the first pressure $P_i$ to the second pressure $P_h$ through the supply of a process gas and the regulation of an exhaust valve. In the pressurizing operation (S10), the pressure is raised so as to perform the depressurizing operation (S30) which will be described later.

Here, the pressurizing operation (S10) may be performed by controlling supplying and venting of the process gas with respect to the processing space S.

That is, the pressurizing operation (S10) may be performed by controlling the supplying and venting of the process gas so as to raise the pressure of the processing space S, that is, so as to increase an amount of the process gas residing therein.

For example, in the pressurizing operation (S10), a process gas-supplying flow rate M1 may remain constant in a state in which the venting is cut off, or the process gas-supplying flow rate M1 may be reduced over time as approaching the second pressure Ph.

Also, a change in the process gas-supplying flow rate M1 of the pressurizing operation (S10) may be continuous over time, or may be made in stages, that is, discontinuous.

The first pressure $P_i$ may be set variously as an initial pressure when the substrate processing method according to the present invention is performed, and the first pressure $P_i$ is set to be lower than the second pressure Ph.

Here, as illustrated in FIGS. 1A to 1C, the pressurizing operation (S30) is an operation of decreasing the internal pressure of the chamber 10 from the second pressure $P_h$ to a third pressure Pf, and the pressurizing operation (S30) may be performed under various times and pressures.

In detail, in the depressurizing operation (S30), the pressure within the processing space S is reduced from the second pressure $P_h$ to the third pressure $P_f$ through the supply of the process gas and the regulation of the exhaust valve.

Here, the depressurizing operation (S30) may be performed by controlling the supplying and venting of the process gas with respect to the processing space S.

That is, the depressurizing operation (S30) may be performed by controlling the supplying and venting of the process gas so as to reduce the pressure of the processing space S, that is, so as to reduce the amount of the process gas residing therein.

For example, the pressure of the processing space S may be reduced in the depressurizing operation (S30), by making an amount of process gas being vented greater than a process gas-supplying flow rate M3 while the process gas-supplying flow rate M3 remains constant, or by making the amount of process gas being vented remain constant in a state in which the supply of the process gas is cut off.

Also, a change in the process gas-supplying flow rate M3 of the depressurizing operation (S30) may be continuous over time, or may be made in stages, that is, discontinuous.

Meanwhile, the third pressure $P_f$ in the depressurizing operation (S30) may be the same as the atmospheric pressure or may be a pressure lower than the atmospheric pressure.

When the third pressure $P_f$ is the same as the atmospheric pressure, the pressure may drop through natural venting (for a toxic process gas, coupled to a scrubber) in the depressurizing operation (S30).

When the third pressure $P_f$ is lower than the atmospheric pressure, the internal pressure of the chamber 10 may be regulated by using a vacuum pump (for a toxic process gas, coupled to a scrubber) in the depressurizing operation (S30).

That is, the depressurizing operation (S30) includes: a first depressurizing operation (S31) of decreasing the internal pressure of the chamber 10 from the second pressure $P_h$ to the atmospheric pressure; and a second depressurizing operation (S33) of decreasing the internal pressure of the chamber 10 from the atmospheric pressure to the third pressure $P_f$ lower than the atmospheric pressure. The internal pressure of the chamber 10 may be regulated by using a vacuum pump (for a toxic process gas, coupled to a scrubber) in the second depressurizing operation (S33).

Meanwhile, as illustrated in FIG. 1C, the depressurizing operation (S30) may include an atmospheric pressure holding operation (S32) between the first depressurizing operation (S31) and the second depressurizing operation (S33) so that the internal pressure of the chamber 10 remains at the atmospheric pressure for a predetermined period of time.

The atmospheric pressure holding operation (S32) is an operation of holding the internal pressure at the atmospheric pressure for a predetermined period of time before the first depressurizing operation (S31) having the internal pressure higher than the atmospheric pressure is changed to the second depressurizing operation (S33) having the internal pressure lower than the atmospheric pressure. The atmospheric pressure holding operation (S32) may minimize the risk of explosion or ignition which occurs as high-concentration process gases are discharged simultaneously when the process gases such as $H_2$ are vented.

The pressure holding operation (S20) may be provided before the pressurizing operation (S10) is changed to the depressurizing operation (S30) in the pressure changing operation (S1), and the pressure remains at the second pressure $P_h$ for a predetermined period of time in the pressure holding operation (S20).

Here, as illustrated in FIGS. 1B to 1C, the pressure holding operation (S20) is an operation of holding the internal pressure of the chamber 10 at the second pressure $P_h$ for a predetermined period of time, and the pressure holding operation (S20) may be performed under various times and pressures.

In detail, in the pressure holding operation (S20), the pressure within the processing space S remains at the second pressure $P_h$ through the supply of the process gas and the regulation of the exhaust valve.

Here, the pressure holding operation (S20) may be performed by controlling the supplying and venting of the process gas with respect to the processing space S.

That is, the pressure holding operation (S20) may be performed by controlling the supplying and venting of the process gas so as to hold the pressure of the processing space S, that is, so as to constantly hold the amount of the process gas residing therein.

Also, in the pressure holding operation (S20), the supplying and venting of the process gas is controlled to hold the pressure at the second pressure Ph. Also, the pressure holding operation (S20) is performed by holding a process gas-supplying flow rate M2 constantly (ideally, controlling a rate between the supplying and venting), or the process gas M2 may be minutely changed over time.

For example, the process gas-supplying flow rate M2 in the pressure holding operation (S20) may be equal to the process gas-supplying flow rate M1 in the pressurizing operation (S10). However, it is preferable that the process gas-supplying flow rate M2 is less than the gas-supplying flow rate M1 of the pressurizing operation (S10) to reduce the processing capacity of the scrubber and the usage costs of the process gas.

Also, a change in the process gas-supplying flow rate M2 of the pressure holding operation (S20) may be continuous over time, or may be made in stages, that is, discontinuous.

Meanwhile, in the pressure holding operation (S20), the second pressure $P_h$ may be set variously according to conditions for improving the thin-film properties, and is preferably higher than the atmospheric pressure.

For example, the second pressure $P_h$ may be set from about 1 atm to about 30 atm, and may be set to about 2 atm when a TiN thin film is processed.

Also, the time for performing the pressure holding operation (S20) may be set according to the conditions for improving the thin-film properties.

Meanwhile, in order to reduce the pressure within the chamber 10 to the third pressure $P_f$ lower than the second pressure $P_h$ in the depressurizing operation (S30), the process gas-supplying flow rate M3 to the processing space S may be reduced, and preferably, the supply of the process gas may cut off.

In detail, the process gas-supplying flow rate M3 in the depressurizing operation (S30) may be less than at least one of the process gas-supplying flow rates M1 and M2 in the pressurizing operation (S10) and the pressure holding operation (S20).

In more detail, the process gas-supplying flow rate M3 in the depressurizing operation (S30) may be about 30% or less of the process gas-supplying flow rate M1 in the pressurizing operation (S10).

Here, more preferably, the supply of the process gas is cut off in the depressurizing operation (S30), and thus, the process may be performed such that the process gas-supplying flow rate M1 in the depressurizing operation (S30) becomes about 0 L.

As described above, as the process gas-supplying flow rate M3 in the depressurizing operation (S30) is reduced, the usage amount of gas and the capacity of a processing gas scrubber are reduced. Therefore, the costs for substrate processing may be reduced.

Meanwhile, as the pressure changing operation (S1) is performed, impurities within the thin film may be discharged, or the thin-film properties such as compositions or particle sizes may be improved.

In detail, in the pressurizing operation (S10) and the pressure holding operation (S20), pressurization is performed, and simultaneously, a reactive process gas for removing the impurities within the thin film is supplied. Thus, the process gas may deeply penetrate even into a thin film having a high aspect ratio.

Accordingly, coupling to more impurities within the thin film may be made as compared to a case where the reactive process gas is supplied at the atmospheric pressure.

In the depressurizing operation (S30), atoms of the supply process gas, which have been coupled to the impurities within the thin film in the pressurizing operation (S10) and the pressure holding operation (S20), may be diffused out of the thin film.

In detail, as the gas within the processing space S is discharged to the outside in the depressurizing operation (S30), the atoms of the supply process gas coupled to the impurities within the thin film may be diffused out.

However, according to the related art, since the gas is supplied even in the depressurizing operation (S30) as illustrated in FIGS. 2A and 3A, the gas remaining inside the processing space S is not completely vented out when the gas is discharged in the depressurizing operation (S30). Thus, impurities Δ within the thin film were not effectively discharged.

Therefore, according to the present invention, the process gas-supplying flow rate M3 in the depressurizing operation (S30) is reduced as compared to the related art, and thus, the gas within the processing space S is completely vented as much as possible.

That is, according to the present invention, the process gas is vented in a state where the supply of the process gas to the processing space S is cut off in the depressurizing operation (S30), or the process gas is supplied such that the gas-supplying flow rate M3 in the depressurizing operation (S30) becomes smaller than the gas-supplying flow rate M1 or M2 supplied in the pressurizing operation (S10) or the pressure holding operation (S20).

For example, as illustrated in FIGS. 2B and 3B, the supply of the process gas is cut off in the depressurizing operation (S30), and the gas remaining within the chamber 10 is completely vented. Thus, the impurities Δ within the thin film were effectively discharged.

Through the control for the gas-supplying flow rate M3 in the depressurizing operation (S30) as described above, the amount of impurities Δ within the thin film is reduced. Thus, it may be confirmed that sheet resistance of the thin film is reduced, and accordingly, the thin-film properties is improved.

Meanwhile, quantitative effects related to the above were confirmed through experiments as illustrated in FIG. 4.

In embodiments of the experiments illustrated in FIG. 4, as a process of discharging impurities within a TiN thin film by using a $H_2$ process gas with respect to the thin film, a pressure changing process was performed at a temperature of about 600° C. and at about 1 atm to about 2 atm.

Here, the process gas-supplying flow rates M1 and M2 in the pressurizing operation (S10) and the pressure holding operation (S20) were fixed to about 40 L, and only the process gas-supplying flow rate M3 in the depressurizing operation (S30) was changed.

In detail, in a first embodiment, the process gas-supplying flow rate M3 in the depressurizing operation (S30) was set to about 20 L. In this case, sheet resistance was reduced from about 101.7 Ω/sq to about 89.94 Ω/sq, that is, was reduced by about 12% after the depressurizing operation (S30).

In a second embodiment, the process gas-supplying flow rate M3 in the depressurizing operation (S30) was set to about 10 L. In this case, sheet resistance was reduced from about 101.34 Ω/sq to about 88.24 Ω/sq, that is, was reduced by about 13% after the depressurizing operation (S30).

In a third embodiment, the process gas-supplying flow rate M3 was set to about 0 L by cutting off the supply of the process gas in the depressurizing operation (S30). In this case, sheet resistance was reduced from about 102.05 Ω/sq to about 87.09 Ω/sq, that is, was reduced by about 15% after the depressurizing operation (S30).

To summarize, as the process gas-supplying flow rate M3 in the depressurizing operation (S30) is changed to about 20 L, about 10 L, and about 0 L, the sheet resistance of the thin film after the depressurizing operation (S30) is reduced to about 12%, about 13%, and about 15%, respectively. Taking into consideration this tendency, it may be confirmed that a larger amount of impurities within the thin film is removed as the process gas-supplying flow rate M3 in the depressurizing operation (S30) is reduced, and accordingly, the sheet resistance is improved.

Meanwhile, provided is a semiconductor manufacturing method including: a deposition operation of forming a thin film on a surface; and a substrate processing operation of improving thin-film properties after performing the deposition process. The substrate processing operation may be performed at least one time and performed through the substrate processing method as described above.

According to the substrate processing method of the present invention, there is the process of performing pressurization and depressurization inside the chamber during processes. The process gas-supplying flow rate to the processing space is reduced in the depressurizing operation, and thus, the pressure within the chamber is reduced to the third pressure lower than the second pressure. Therefore, the processing capacity of the scrubber and the costs of the usage amount of the process gas may be significantly reduced.

Also, according to the substrate processing method of the present invention, there is the process of performing pressurization and depressurization inside the chamber during processes. In the depressurizing operation, the supply of the process gas to the processing space is cut off, and the process gas in the processing space is vented. Thus, the pressure within the chamber is reduced to the third pressure lower than the second pressure. Therefore, the processing capacity of the scrubber and the costs of the usage amount of the process gas may be further reduced.

Also, according to the substrate processing method of the present invention, in the depressurizing operation, the supply of the process gas is cut off, or the small amount of the process gas is supplied. Thus, the gas remaining inside the chamber is completely vented. Therefore, the impurities remaining on the substrate may be effectively moved.

Also, according to the substrate processing method of the present invention, in the depressurizing operation, the supply of the process gas is cut off, or the small amount of the process gas is supplied. Thus, a larger amount of impurities inside the chamber may be discharged to the outside compared to the related art.

Also, according to the substrate processing method of the present invention, in the depressurizing operation, the supply of the process gas is cut off, or the small amount of the process gas is supplied. Thus, a larger amount of impurities inside the thin film is discharged to the outside, and accordingly, the sheet resistance within the thin film is reduced. Therefore, the thin-film properties may be improved.

The above is merely described with respect to some preferred embodiments that may be implemented according to the present invention. Thus, as is well known, the scope of the present invention should not be construed as being limited by the above embodiments, and the technical ideas of the present invention described above and technical concepts on the basis of these technical ideas are considered to be included in the scope of the present invention.

What is claimed is:

1. A substrate processing method using a substrate processing apparatus which comprises a chamber configured to form a processing space for substrate processing, a substrate support installed in the chamber to support a substrate, a gas sprayer installed above the substrate support to spray a gas for performing processes, and a vent configured to vent a gas of the processing space and comprising a valve for controlling a pressure,
  wherein the substrate processing method does not require impurity concentration detection and comprises a pressure changing operation repeated at least one time,
  wherein the pressure changing operation comprises:
  a pressurizing operation of increasing an internal pressure of the chamber from a first pressure to a second pressure higher than the atmospheric pressure, by injecting a process gas into the processing space; and
  a depressurizing operation of decreasing the internal pressure of the chamber from the second pressure higher than the atmospheric pressure to a third pressure,
  wherein a process gas-supplying flow rate in the depressurizing operation is lower than a process gas-supplying flow rate in the pressurizing operation, and
  the third pressure is equal to or less than the atmospheric pressure.

2. The substrate processing method of claim 1, wherein the depressurizing operation comprises:
  a first depressurizing operation of decreasing the internal pressure of the chamber from the second pressure to the atmospheric pressure; and
  a second depressurizing operation of decreasing the internal pressure of the chamber from the atmospheric pressure to the third pressure lower than the atmospheric pressure,
  wherein the internal pressure of the chamber is regulated by using a vacuum pump in the second depressurizing operation.

3. The substrate processing method of claim 2, wherein the depressurizing operation comprises an atmospheric pressure holding operation before the internal pressure is changed to the second depressurizing operation after reaching the atmospheric pressure from the first depressurizing operation,
  wherein the internal pressure of the chamber remains at the atmospheric pressure for a predetermined period of time in the atmospheric pressure holding operation.

4. The substrate processing method of claim 1, comprising a pressure holding operation before the pressurizing operation is changed to the depressurizing operation after reaching the second pressure,
  wherein the internal pressure of the chamber remains at the second pressure for a predetermined period of time in the pressure holding operation.

5. The substrate processing method of claim 4, wherein a process gas-supplying flow rate in the pressure holding operation is lower than the process gas-supplying flow rate in the pressurizing operation.

6. The substrate processing method of claim 1, wherein in the depressurizing operation, the internal pressure of the chamber is reduced by cutting off the supply of the process gas to the processing space and venting the process gas.

7. The substrate processing method of claim 1, wherein a thin film formed on the substrate is made of one of Ti, TiN, W, and WN.

8. The substrate processing method of claim 1, wherein the process gas comprises one of $H_2$, $D_2$, and $NH_3$, or a combination thereof.

9. The substrate processing method of claim 1, wherein the pressure changing operation is performed at a temperature of about 400° C. to about 800° C.

10. A semiconductor device manufacturing method, which does not require impurity concentration detection, the method comprising:
  a deposition operation of forming a thin film on a surface; and
  a substrate processing operation of improving thin-film properties after performing the deposition process,
  wherein the substrate processing operation is performed at least one time, and
  wherein the substrate processing operation is performed through a substrate processing method, the substrate processing method using a substrate processing apparatus which comprises a chamber configured to form a processing space for substrate processing, a substrate support installed in the chamber to support a substrate, a gas sprayer installed above the substrate support to spray a gas for performing processes, and a vent configured to vent a gas of the processing space and comprising a valve for controlling a pressure,
  wherein the substrate processing method comprises a pressure changing operation repeated at least one time,
  wherein the pressure changing operation comprises:
  a pressurizing operation of increasing an internal pressure of the chamber from a first pressure to a second pressure higher than the atmospheric pressure, by injecting a process gas into the processing space; and
  a depressurizing operation of decreasing the internal pressure of the chamber from the second pressure to a third pressure,
  wherein a process gas-supplying flow rate in the depressurizing operation is lower than a process gas-supplying flow rate in the pressurizing operation, and
  the third pressure is equal to or less than the atmospheric pressure.

11. A substrate processing method using a substrate processing apparatus which comprises a chamber configured to form a processing space for substrate processing, a substrate support installed in the chamber to support a substrate, a gas sprayer installed above the substrate support to spray a gas for performing processes, and a vent configured to vent a gas of the processing space and comprising a valve for controlling a pressure, wherein the chamber comprises: an outer tube which has a protection space formed therein and a first inlet formed in a lower portion thereof; and an inner tube which has the processing space formed therein and a second inlet formed in a lower portion thereof, wherein a portion of the inner tube is accommodated in the outer tube, and a portion of the inner tube, in which the second inlet is formed, protrudes to the outside of the outer tube,
  wherein the substrate processing method does not include impurity concentration detection and comprises a pressure changing operation repeated at least one time,
  wherein the pressure changing operation comprises:
  a pressurizing operation of increasing an internal pressure of the inner tube from a first pressure to a second pressure higher than the atmospheric pressure, by injecting a process gas into the processing space; and
  a depressurizing operation of decreasing the internal pressure of the inner tube from the second pressure higher than the atmospheric pressure to a third pressure,
  wherein a process gas-supplying flow rate to the inner tube in the depressurizing operation is lower than a process gas-supplying flow rate to the inner tube in the pressurizing operation, and
  the third pressure is equal to or less than the atmospheric pressure.

12. The substrate processing method of claim 11, wherein the depressurizing operation comprises:
- a first depressurizing operation of decreasing the internal pressure of the inner tube from the second pressure to the atmospheric pressure; and
- a second depressurizing operation of decreasing the internal pressure of the inner tube from the atmospheric pressure to the third pressure lower than the atmospheric pressure,
- wherein the internal pressure of the inner tube is regulated by using a vacuum pump in the second depressurizing operation.

13. The substrate processing method of claim 12, wherein the depressurizing operation comprises an atmospheric pressure holding operation before the internal pressure is changed to the second depressurizing operation after reaching the atmospheric pressure from the first depressurizing operation,
- wherein the internal pressure of the inner tube remains at the atmospheric pressure for a predetermined period of time in the atmospheric pressure holding operation.

14. The substrate processing method of claim 11, comprising a pressure holding operation before the internal pressure is changed to the depressurizing operation after reaching the second pressure from the pressurizing operation,
- wherein the internal pressure of the inner tube remains at the second pressure for a predetermined period of time in the pressure holding operation.

15. The substrate processing method of claim 14, wherein a process gas-supplying flow rate to the inner tube in the pressure holding operation is lower than the process gas-supplying flow rate to the inner tube in the pressurizing operation.

16. The substrate processing method of claim 11, wherein in the depressurizing operation, the internal pressure of the inner tube is reduced by cutting off the supply of the process gas to the processing space and venting the process gas.

17. The substrate processing method of claim 11, wherein a thin film formed on the substrate is made of one of Ti, TiN, W, and WN.

18. The substrate processing method of claim 11, wherein the process gas comprises one of $H_2$, $D_2$, and $NH_3$, or a combination thereof.

19. The substrate processing method of claim 11, wherein the pressure changing operation is performed at a temperature of about 400° C. to about 800° C.

20. A semiconductor device manufacturing method, which does not include impurity concentration detection, the method comprising:
- a deposition operation of forming a thin film on a surface; and
- a substrate processing operation of improving thin-film properties after performing the deposition process,
- wherein the substrate processing operation is performed at least one time, and
- wherein the substrate processing operation is performed through a substrate processing method, the substrate processing method using a substrate processing apparatus which comprises a chamber configured to form a processing space for substrate processing, a substrate support installed in the chamber to support a substrate, a gas sprayer installed above the substrate support to spray a gas for performing processes, and a vent configured to vent a gas of the processing space and comprising a valve for controlling a pressure, wherein the chamber comprises: an outer tube which has a protection space formed therein and a first inlet formed in a lower portion thereof; and an inner tube which has the processing space formed therein and a second inlet formed in a lower portion thereof, wherein a portion of the inner tube is accommodated in the outer tube, and a portion of the inner tube, in which the second inlet is formed, protrudes to the outside of the outer tube,
- wherein the substrate processing method comprises a pressure changing operation repeated at least one time,
- wherein the pressure changing operation comprises:
- a pressurizing operation of increasing an internal pressure of the inner tube from a first pressure to a second pressure higher than the atmospheric pressure, by injecting a process gas into the processing space; and
- a depressurizing operation of decreasing the internal pressure of the inner tube from the second pressure to a third pressure,
- wherein a process gas-supplying flow rate to the inner tube in the depressurizing operation is lower than a process gas-supplying flow rate to the inner tube in the pressurizing operation, and
- the third pressure is equal to or less than the atmospheric pressure.

* * * * *